United States Patent
Doogue et al.

(10) Patent No.: US 7,859,255 B2
(45) Date of Patent: Dec. 28, 2010

(54) MATCHING OF GMR SENSORS IN A BRIDGE

(75) Inventors: Michael C. Doogue, Manchester, NH (US); William P. Taylor, Amherst, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 0 days.

(21) Appl. No.: 12/840,717

(22) Filed: Jul. 21, 2010

(65) Prior Publication Data

US 2010/0283458 A1 Nov. 11, 2010

Related U.S. Application Data

(62) Division of application No. 11/876,048, filed on Oct. 22, 2007.

(51) Int. Cl.
*G01B 7/30* (2006.01)
*G01R 33/09* (2006.01)

(52) U.S. Cl. .............. 324/207.25; 257/427; 324/252

(58) Field of Classification Search ........... 324/207.21, 324/207.25, 252; 257/427; 365/8; 360/324–327, 360/313–316
See application file for complete search history.

(56) References Cited

U.S. PATENT DOCUMENTS

| | | | |
|---|---|---|---|
| 3,858,189 A | 12/1974 | Beausoleil et al. | |
| 3,860,965 A | 1/1975 | Voegeli | |
| 4,035,785 A * | 7/1977 | Kryder | 365/8 |
| 4,159,537 A * | 6/1979 | Schwartz | 365/8 |
| 4,343,026 A | 8/1982 | Griffith et al. | |
| 4,432,069 A | 2/1984 | Rose et al. | |
| 4,525,668 A * | 6/1985 | Lienhard et al. | 324/142 |
| 4,596,950 A | 6/1986 | Lienhard et al. | |
| 4,691,259 A | 9/1987 | Imakoshi | |
| 4,712,064 A | 12/1987 | Eckardt et al. | |
| 4,823,075 A | 4/1989 | Alley | |
| 4,847,584 A | 7/1989 | Pant | |
| 4,860,432 A * | 8/1989 | Kawata | 29/602.1 |
| 4,937,521 A | 6/1990 | Yoshino et al. | |
| 4,939,448 A | 7/1990 | Gudel | |
| 4,939,449 A | 7/1990 | Callaneo et al. | |
| 4,939,459 A | 7/1990 | Akachi et al. | |
| 5,041,780 A | 8/1991 | Rippel | |
| 5,049,809 A | 9/1991 | Wakatsuki et al. | |
| 5,227,721 A | 7/1993 | Katnoka et al. | |
| 5,260,653 A | 11/1993 | Smith et al. | |
| 5,500,590 A | 3/1996 | Pant | |
| 5,561,366 A | 10/1996 | Takahashi et al. | |

(Continued)

FOREIGN PATENT DOCUMENTS

DE    4212737    7/1993

(Continued)

OTHER PUBLICATIONS

Notification of Transmittal of the International Search Report and International Search Report for PCT/US03/34141 dated Jun. 17, 2004, 7 pages.

(Continued)

*Primary Examiner*—Bot L LeDynh
(74) *Attorney, Agent, or Firm*—Daly, Crowley, Mofford & Durkee, LLP

(57) ABSTRACT

A magnetoresistive (MR) sensing device includes MR elements electrically connected to form a bridge circuit and one or more non-functional (or "dummy") MR elements for improved matching of the bridge circuit MR elements.

11 Claims, 6 Drawing Sheets

U.S. PATENT DOCUMENTS

| | | | |
|---|---|---|---|
| 5,561,368 | A | 10/1996 | Dovek et al. |
| 5,570,034 | A | 10/1996 | Needham et al. |
| 5,583,725 | A | 12/1996 | Coffey et al. |
| 5,617,071 | A | 4/1997 | Daughton |
| 5,621,377 | A | 4/1997 | Dettmann et al. |
| 5,686,838 | A | 11/1997 | van den Berg |
| 5,719,494 | A | 2/1998 | Dettmann et al. |
| 5,831,426 | A | 11/1998 | Black, Jr. et al. |
| 5,877,705 | A | 3/1999 | Sampey |
| 5,945,825 | A | 8/1999 | Clemens |
| 5,952,825 | A | 9/1999 | Wan |
| 6,002,553 | A | 12/1999 | Stearns et al. |
| 6,021,065 | A | 2/2000 | Daughton et al. |
| 6,031,273 | A | 2/2000 | Torok et al. |
| 6,100,686 | A | 8/2000 | Van Delden et al. |
| 6,175,296 | B1 | 1/2001 | Tokunaga et al. |
| 6,300,617 | B1 | 10/2001 | Daughton et al. |
| 6,315,875 | B1 | 11/2001 | Sasaki |
| 6,316,931 | B1 | 11/2001 | Nakagawa et al. |
| 6,323,634 | B1 | 11/2001 | Nakagawa et al. |
| 6,329,818 | B1 | 12/2001 | Tokunaga et al. |
| 6,331,773 | B1 | 12/2001 | Engel |
| 6,392,852 | B1 | 5/2002 | Sasaki |
| 6,404,191 | B2 | 6/2002 | Daughton et al. |
| 6,411,078 | B1 | 6/2002 | Nakagawa et al. |
| 6,429,640 | B1 | 8/2002 | Daughton et al. |
| 6,437,558 | B2 | 8/2002 | Li et al. |
| 6,445,171 | B2 | 9/2002 | Sandquist et al. |
| 6,459,255 | B1 | 10/2002 | Tamai et al. |
| 6,462,541 | B1 | 10/2002 | Wang et al. |
| 6,501,678 | B1 | 12/2002 | Lenssen et al. |
| 6,566,856 | B2 | 5/2003 | Sandquist et al. |
| 6,591,481 | B2 | 7/2003 | Shimazawa et al. |
| 6,642,705 | B2 | 11/2003 | Kawase |
| 6,657,826 | B2 | 12/2003 | Shimazawa et al. |
| 6,664,785 | B2 | 12/2003 | Kohlstedt |
| 6,667,682 | B2 | 12/2003 | Wan et al. |
| 6,721,140 | B2 | 4/2004 | Inoue et al. |
| 6,759,841 | B2 | 7/2004 | Goto et al. |
| 6,781,359 | B2 | 8/2004 | Stauth et al. |
| 6,967,798 | B2 | 11/2005 | Homola et al. |
| 6,970,333 | B2 | 11/2005 | Boeve |
| 7,071,074 | B2 | 7/2006 | Schmidt et al. |
| 7,248,045 | B2 | 7/2007 | Shoji |
| 7,259,545 | B2 | 8/2007 | Stauth et al. |
| 7,336,064 | B2 | 2/2008 | Ludwig et al. |
| 7,495,624 | B2 | 2/2009 | Daalmans |
| 2002/0024337 | A1 | 2/2002 | Levert et al. |
| 2002/0180433 | A1 | 12/2002 | Van Zon et al. |
| 2002/0186011 | A1 | 12/2002 | Murata et al. |
| 2004/0023064 | A1 | 2/2004 | Ehresmann et al. |
| 2004/0137275 | A1 | 7/2004 | Jander et al. |
| 2006/0071655 | A1 | 4/2006 | Shoji |
| 2006/0077598 | A1 | 4/2006 | Taylor et al. |
| 2006/0087318 | A1 | 4/2006 | Crolly et al. |
| 2006/0091993 | A1 | 5/2006 | Shoji |
| 2006/0114098 | A1 | 6/2006 | Shoji |
| 2006/0145690 | A1 | 7/2006 | Shoji |
| 2006/0170529 | A1 | 8/2006 | Shoji |
| 2006/0291106 | A1 | 12/2006 | Shoji |
| 2007/0044370 | A1 | 3/2007 | Shoji |
| 2007/0076332 | A1 | 4/2007 | Shoji et al. |
| 2007/0090825 | A1 | 4/2007 | Shoji |
| 2007/0096716 | A1 | 5/2007 | Shoji |
| 2007/0134921 | A1 | 6/2007 | Tian et al. |
| 2007/0188946 | A1 | 8/2007 | Shoji |

FOREIGN PATENT DOCUMENTS

| | | |
|---|---|---|
| DE | 196 50 078 | 6/1998 |
| DE | 10017374 | 12/2000 |
| DE | 10159607 | 9/2002 |
| DE | 10128150 | 1/2003 |
| DE | 10202287 | 8/2003 |
| DE | 10222395 | 12/2003 |
| DE | 102004003369 | 8/2005 |
| DE | 102004009267 | 9/2005 |
| DE | 102004038847 | 9/2005 |
| DE | 102004040079 | 12/2005 |
| DE | 10155423 | 3/2006 |
| DE | 102005037905 | 3/2006 |
| DE | 102004053551 | 5/2006 |
| DE | 102006008257 | 10/2006 |
| DE | 102006021774 | 1/2007 |
| DE | 102005038655 | 3/2007 |
| DE | 102005040539 | 3/2007 |
| DE | 102005052688 | 5/2007 |
| DE | 102006007770 | 8/2007 |
| DE | 102006028698 | 12/2007 |
| EP | 0 710 850 | 4/1993 |
| EP | 0539081 | 4/1993 |
| EP | 1 720 027 | 11/2006 |
| FR | 2 212 609 | 7/1974 |
| FR | 2537321 | 6/1984 |
| JP | 57187671 | 5/1981 |
| JP | 2000174358 | 6/2000 |
| JP | 2001 345498 | 12/2001 |
| JP | 2002353418 | 12/2002 |
| JP | 2003 179283 | 6/2003 |
| JP | 2003525528 | 8/2003 |
| JP | 2004 117367 | 4/2004 |
| JP | 2006 126087 | 5/2006 |
| WO | WO 2004/109725 | 12/2004 |
| WO | WO 2005/064357 | 7/2005 |
| WO | WO 2006/040719 | 4/2006 |
| WO | WO 2006/136577 | 12/2006 |
| WO | WO 2007/147760 | 12/2007 |

OTHER PUBLICATIONS

Notification of Transmittal of the International Search Report and the Written Opinion of the International Searching Authority, International Search Report and Written Opinion of the International Searching Authority for PCT/US2008/075556 dated Dec. 30, 2008, 17 pages.

Notificiation Concerning Transmittal of International Preliminary Report on Patentability and International Preliminary Report on Patentability dated May 6, 2010 for PCT/US2008/075556 filed on Sep. 8, 2008, 9 pages.

Notification of Transmittal of the International Search Report and the Written Opinion of the International Searching Authority, International Search Report and Written Opinion of the International Searching Authority for PCT/US2005/029982 dated Jan. 18, 2006, 11 pages.

Notification Concerning Transmittal of International Preliminary Report on Patentability and International Preliminary Report on Patentability dated Apr. 26, 2007 for PCT/US2005/029982 filed on Aug. 22, 2005, 7 pages.

Office Action dated Feb. 19, 2010 for Japanese Appl. No. 2007-536689, filed Apr. 12, 2007, 4 pages.

European Official Communication dated Apr. 25, 2008 for EP 05794713.7, 7 pages.

Response dated Nov. 5, 2008 to European Official Communication dated Apr. 25, 2008 for EP 05794713.7, 15 pages.

European Official Communication dated Oct. 2, 2009 for EP 05794713.7, 6 pages.

Response dated Apr. 12, 2010 to European Official Communication dated Oct. 2, 2009 for EP 05794713.7, 11 pages.

Data Sheet; "High-Speed Digital Isolators, AduM1100AR/AduM1100BR;" as published by Analog Devices, Inc.; 2001, pp. 1-12.

"Utilization of GMR Materials. Analog Bridge Output Devices;" pp. 1-3; NVE Corporation on website: www.nve.com/technical/explinations//Bridge.html, 2000.

Daughton J et al: "Magnetic Field Sensors Using GMR Multilayer", IEE Transactions on Magnetics, IEEE Service Center, New York, NY, US, vol. 30, No. 6, Nov. 1, 1994, p. 4608-4610, XP000674135. isn: 0018-9464, the whole document; figure 4.

Prinz G A: "Magnetoelectronics Applications" Journal of Magnetism and Magnetic Materials, Elsevier Science Publishers, Amsterdam, NL, vol. 200, No. 1-3, Oct. 1, 1999, pp. 57-68, XP004364006. ISSN: 0304-8853, p. 59; figure 3.

Jaquelin K Spong et al: "Giant Magnetoresistive Spin Valve Bridge Sensor", IEEE Transactions on Magnetics, IEEE Service Center, New York, NY, US, vol. 32, No. 2, Mar. 1, 1996, pp. 366-371, XP011030196; ISSN: 0018-9464; the whole document.

Takenaga et al., "High-Temperature Operations of Rotation Angle Sensors With Spin-Valve-Type Magnetic Tunnel Junctions", IEEE Transactions on Magnetics; vol. 41, No. 10; Oct. 2005, pp. 3628-3630.

Hirota et al., "Giant Magnetic-Resistance Devices;" Springer Series in Surface Sciences, 40; ISBN-10:3540418199, ISBN-13: 9783540418191; pp. 10-77.

File downloaded for U.S. Appl. No. 10/962,889, filed Oct 12, 2004, file through Aug. 31, 2010, 308 pages.

File downloaded for U.S. Appl. No. 11/876,048, filed Oct 22, 2007, file through Sep. 10, 2010, 367 pages.

International Search Report and Written Opinion of the International Searching Authority for PCT/US2008/075556 dated Dec. 30, 2008, 17 pages.

\* cited by examiner

MATCHING OF GMR SENSORS IN A BRIDGE

CROSS-REFERENCE TO RELATED APPLICATIONS

This application is a divisional of U.S. patent application Ser. No. 11/876,048 filed on Oct. 22, 2007, which is incorporated herein by reference.

STATEMENT REGARDING FEDERALLY SPONSORED RESEARCH

Not applicable.

FIELD OF THE INVENTION

This invention relates generally to magnetic field sensors, and more particularly, to the design of magnetic field sensors that use magnetoresistive (MR) elements to sense an external magnetic field.

BACKGROUND OF THE INVENTION

In analog integrated circuit (IC) design, it is important to use matched devices, that is, devices designed to have the same electrical properties, to achieve highly accurate circuit performance. Thus, a critical design challenge involves the variability of the individual devices built on the IC. Sources of mismatch include variation in geometrical shapes, poor layout and non-uniformities in fabrication process and operating environment. Fabrication processing non-uniformity may be introduced by, for example, mask misalignment and non-uniform etching.

Certain types of devices are very sensitive to neighboring devices. Neighbor interactions can contribute significantly to device mismatch as well.

SUMMARY OF THE INVENTION

In general, in one aspect, the invention is directed to a sensor that includes one or more magnetoresistive (MR) elements and one or more dummy MR elements. Each such dummy MR element is disposed near a select one of the one or more MR elements.

Embodiments of the invention may include one or more of the following features. The one or more MR elements and the one or more dummy MR elements may be giant magnetoresistance (GMR) elements, magnetic tunnel junction (MTJ) elements, tunneling magnetoresistance (TMR) elements or anisotropic magnetoresistance (AMR) elements. The one or more MR elements may be MR elements electrically connected to form a bridge circuit, and each dummy MR element may be disposed near a select one of the MR elements of the bridge circuit. The select one of the MR elements may have as neighboring elements another of the MR elements of the bridge circuit and the dummy MR element where the neighboring elements are disposed on opposite sides of the select one of the MR elements and are symmetrical in terms of structure and position relative to the select one of the MR elements. The bridge circuit may be a full bridge circuit or a half bridge circuit. The neighboring elements may be shielded MR elements. The dummy MR element may be connected to a voltage supply so that, during sensor operation, the neighboring elements carry current of similar magnitude. All of the MR elements of the bridge circuit may be active MR elements. The sensor may further include an amplifier connected to output of the bridge circuit and a conductor through which current is applied, wherein the amplifier provides as an output an output voltage proportional to the applied current.

In another aspect, the invention is directed to an angle measurement device. The angle measurement device includes a first sensing device and a second sensing device. Each of the first and second sensing devices includes MR elements electrically connected to form a bridge circuit and one or more dummy MR elements. Each such dummy MR element is disposed near a select one of the MR elements. The MR elements of the second sensing device are provided at a predetermined angle relative to the MR elements of the first sensing device.

In yet another aspect, the invention is directed to a sensing device that includes MR elements electrically connected to form a bridge circuit and a dummy MR element. One of the MR elements of the bridge circuit is an active MR element and has as neighboring elements another of the MR elements of the bridge circuit and the dummy MR element. The neighboring elements are disposed on opposite sides of the active MR element and are symmetrical in terms of structure and position relative to the active MR element.

Particular implementations of the invention may provide one or more of the following advantages. Dummy MR elements can provide symmetry to the bridge circuit layout where such symmetry might otherwise be lacking. Symmetry in the MR elements near an active MR element serves to reduce variations caused by nearest neighbor induced magnetic field effects. In addition, the dummy MR elements may be provided at the outermost edges of the bridge circuit layout so that the bridge MR elements can be uniformly patterned.

BRIEF DESCRIPTION OF THE DRAWINGS

The foregoing features of the invention, as well as the invention itself may be more fully understood from the following detailed description of the drawings, in which.

DETAILED DESCRIPTION

Resistor mismatch can be a serious problem in the design of resistive bridge circuits that require resistors in the bridge to have the same value. This is especially true in the case of bridge circuits used in magnetoresistive (MR) sensors. An MR sensor is a magnetic field sensor that makes use of the MR effect, the property of a current carrying material to change its resistance in the presence of an external magnetic field. The MR type resistors or "magnetoresistors" of the sensor's bridge circuit, referred to herein as MR elements, are very sensitive to the stray magnetic field effects of neighboring MR elements. Neighboring interactions can result in variations in an MR element's electrical behavior. Any variation, however small, can limit sensitivity and overall accuracy of the MR sensor. The circuits of an MR sensor, like other types of circuits, are also affected by non-uniformities introduced by a particular process during device fabrication. Often the processing-related non-uniformities occur at the outer edges of the circuit layout and thus affect the outside elements. For example, the outside elements may be etched at a faster rate due to a higher concentration of etchant at the outer edges of the circuit layout (and therefore have a higher resistance) than those elements that are not outside elements.

To mitigate the effects of layout dependent sensitivity and/or processing related non-uniformity in the sensor circuitry, therefore, the present invention features the use of "dummy MR elements" disposed near select MR elements of a bridge circuit. The dummy MR elements are non-functional elements, those that are not part of or required for the operation of the bridge circuit. The dummy MR elements may be used in various locations (in the bridge layout) and for various reasons, as will be described.

The MR elements referred to herein may be made from any type of MR device, including, but not limited to: a anisotropic magnetoresistance (AMR) device; a giant magnetoresistance (GMR) device, including unpinned sandwich, antiferromagnetic multilayers and spin valve; a magnetic tunnel junction (MTJ, also known as spin-dependent tunneling or "SDT") device; and a tunneling magnetoresistance (TMR) device.

Figure 1:
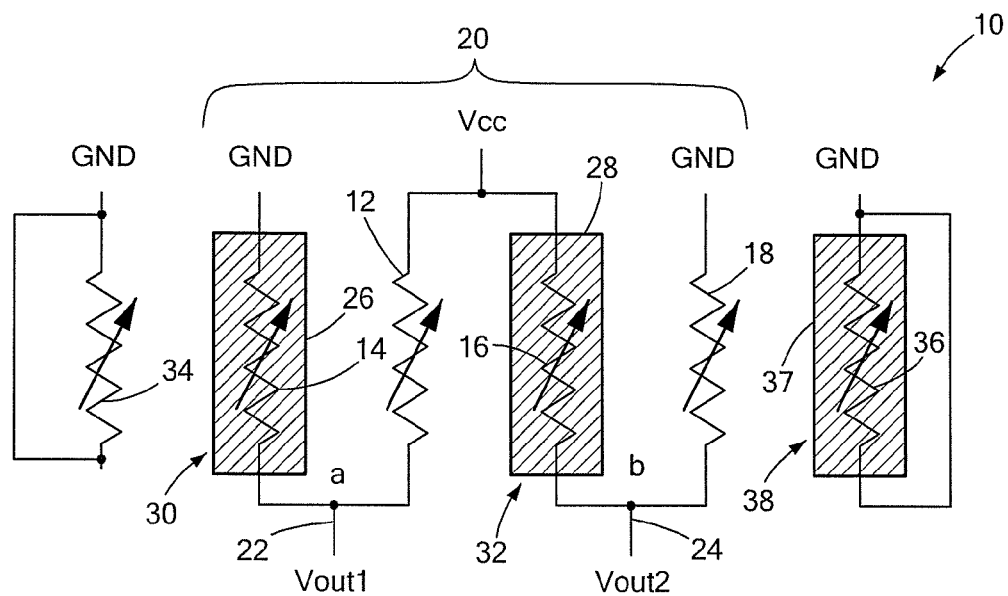
FIG. 1 shows an exemplary magnetoresistive (MR) sensing device that includes a full bridge (of four MR elements) and two dummy MR elements.

Referring to FIG. 1, an MR sensing device 10 that includes MR elements 12, 14, 16, 18 connected to form a full (or "Wheatstone") bridge circuit 20 is shown. The labels "VCC" and "GND" indicate voltage supply and ground terminals, respectively. On one side of the bridge circuit, the MR elements 12 and 14 are connected in series between VCC and GND. On the other side of the bridge circuit, the MR elements 16 and 18 are connected in series between VCC and GND. A first output (Vout1) 22 is provided between MR elements 12, 14, at a node "a". A second output (Vout2) 24 is provided between MR elements 16, 18, at a node "b".

In the embodiment shown in FIG. 1, two of the four MR elements, MR element 14 and MR element 16, are covered by magnetic shields, which isolate those elements from the applied magnetic field and allow them to act as reference elements. The MR elements 14, 16 are covered by magnetic shields 26, 28, respectively. The MR elements 14, 16 with magnetic shields are shown as shielded MR elements 30, 32, respectively. The two remaining MR elements, MR elements 12 and 18, are exposed to the magnetic field and thus operate as active (or sensing) elements. The magnetic shielding may be achieved by surrounding the MR element with a high-permeability material such as NiFe. The magnetic shielding may be a multilayer shielding.

During operation, a differential output voltage is available between the bridge circuit outputs 22, 24. More specifically, with power supplied to the bridge circuit, the presence of a magnetic field causes a change in resistance in the bridge MR elements and the change in resistance produces a corresponding change in voltage across the bridge outputs 22, 24. The MR elements are oriented such that the sensitive axis (indicated schematically by the arrows) of each element is in parallel to the sensitive axis of the other elements. The voltage across outputs 22, 24 increases as the magnetic field in the direction of the sensitive axis increases.

The sensing device 10 also includes at least one dummy MR element. In the embodiment depicted in FIG. 1, there are two dummy elements, shown as dummy MR element 34 and dummy MR element 36. A magnetic shield 37 is provided to dummy MR element 36, with the magnetic shield 37 and dummy MR element 36 thus forming a shielded dummy MR element 38. In this particular embodiment, each of the dummy MR elements is connected at both ends to GND, as shown.

Although the sensing device 10 is illustrated by a schematic diagram, the arrangement of MR elements in this figure (as well as other figures to be described later) is intended to suggest that of an actual layout (from a plan view) to convey as simplistically as possible how the dummy MR elements are used. Thus, the MR and dummy MR elements of the sensing device 10 are shown to represent corresponding MR patterns disposed horizontally (from left to right) in the order 34, 30, 12, 32, 18, 38. The dummy MR element 34 is disposed on the left side of the shielded MR element 30 and the shielded dummy MR element 38 is disposed on the right side of the MR element 18. Each dummy MR element is placed next to an outside bridge MR element so that that bridge MR element is flanked by like elements. The structure, defined by size, shape, construction and orientation, as well as placement (relative to shielded MR element 30) of the dummy MR element 34 is chosen to be like that of MR element 12. Similarly, the structure and placement (relative to MR element 18) of the shielded dummy MR element 38 is chosen to be like that of shielded MR element 32. Thus, the shielded MR element 32 may be referred to as the like MR element of the shielded dummy MR element 38 and the MR element 12 may be referred to as the like MR element of dummy MR element 34. Because they are fabricated from the same material and processed in the same thin film process steps, the dummy elements and corresponding, like MR elements in the bridge circuit will show very similar characteristics (in terms of various properties, such as electrical, magnetic, thermal and mechanical properties). As mentioned above, the structure of the bridge and dummy MR elements may utilize any type of MR technology, such as GMR, MTJ, TMR and AMR.

The 'like' structure can include magnetic shielding, if the corresponding bridge element is shielded. Thus, in the example shown in FIG. 1, because the bridge MR element 32 is a shielded MR element, the like dummy MR element 38 is provided as a shielded MR element as well. With the addition of the dummy MR elements, the outside MR elements 30 and 18 each now "sees" symmetry in its neighboring elements in the same way that the inside MR elements 12 and 32 do. As a consequence, a more optimal matching of the four MR elements of the bridge circuit is achieved.

At minimum, it is desirable for each "active" bridge element to be symmetrically balanced, using a dummy MR element as necessary (when the active bridge element doesn't already have two neighboring bridge elements) to achieve symmetry. It is the active MR element that is sensitive to neighboring element interactions. The use of dummy MR elements near shielded (or otherwise non-sensing) MR elements can also be advantageous when processing-related non-uniformities that occur at the outer edges of the bridge circuit layout are of particular concern, as the non-uniformities will impact the dummy MR elements (which are not part of the bridge circuit) instead of the bridge elements. The use of only one dummy MR element, if possible, however, allows for simplification in design and reduction in the size of the sensor.

The structure and placement of the dummy MR element are chosen to match (as closely as possible), that of the like bridge MR element located on the opposite side of the outside bridge MR element, that is, the outside bridge MR element's nearest neighboring bridge MR element. In the resulting layout, the outside bridge MR elements will see the same environment (magnetic effects) on both sides. The arrangement of the dummy MR elements relative to the bridge MR elements serves to provide properties of symmetry and uniformity to the outer MR elements in an MR bridge circuit layout for improved resistor matching.

It will be appreciated that, in an actual layout, MR elements of the bridge circuit, in particular GMR and MJT elements, tend to be aligned with one or more of the other MR elements, along horizontal and/or vertical axes. The MR elements could be arranged in an approximately semi-circular, interleaved or some other pattern as well.

Figure 2:
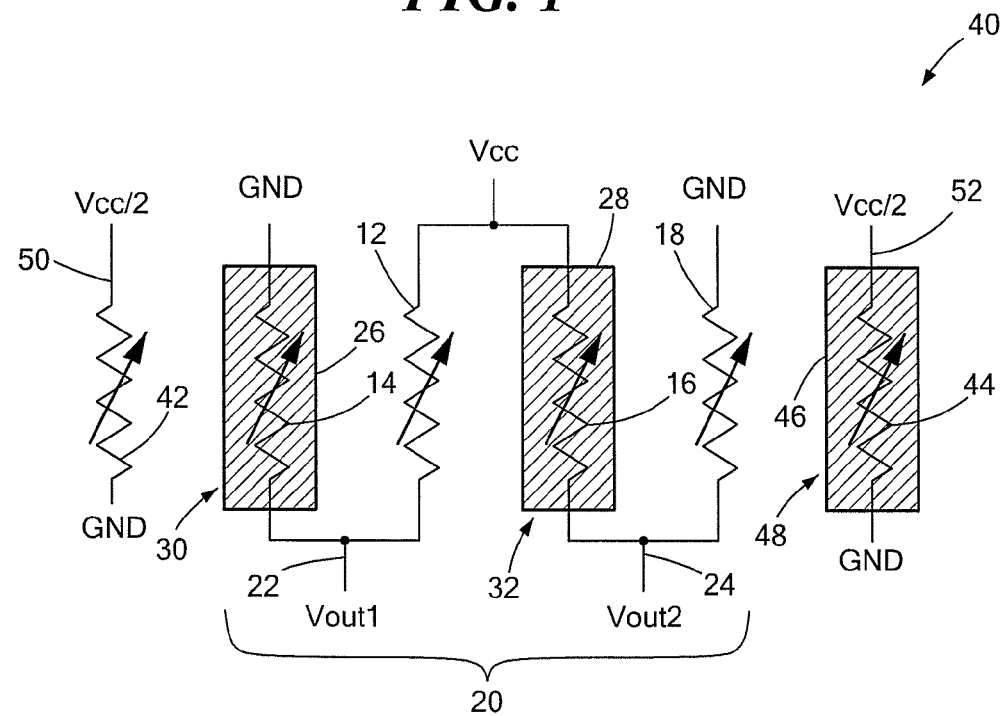
FIG. 2 shows an exemplary MR sensing device that includes a full bridge and two current-carrying dummy MR elements.

In an alternative embodiment, the dummy MR element may be connected at one end to a voltage supply, as shown in FIG. 2. Referring to FIG. 2, a sensing device 40 includes the same full bridge circuit 20 as shown in FIG. 1. In the embodiment illustrated in FIG. 2, however, the dummy MR elements 34, 36 are replaced by current-carrying dummy MR elements 42, 44, respectively, each capable of carrying current similar in magnitude to its corresponding like bridge MR element. The dummy MR element 44, like dummy MR element 36 in FIG. 1, is covered by a magnetic shield (shown as magnetic shield 46). The dummy MR element 44 with magnetic shield 46 is shown as a shielded dummy MR element 48. The magnitude of the current carried by dummy MR element 42 is similar to that of the current carried by the like bridge MR element 12 and the magnitude of the current carried by the shielded dummy MR element 48 is similar to that of the current carried by the like shielded bridge MR element 32. One end of the dummy MR element 42 is coupled to a voltage supply (VCC/2) at terminal 50. The other end of dummy MR element 42 is connected to GND. Likewise, one end of the shielded dummy MR element 48 is coupled to VCC/2 at terminal 52 and the other end is connected to GND. This type of configuration ensures that the dummy MR element and its corresponding like MR bridge element also have similar thermal profiles (for thermal symmetry).

In the bridge configurations shown in FIGS. 1-2, the two active MR elements 12 and 18 are on opposite sides of the bridge circuit and have a like response—they both increase in value or decrease in value. In an alternative configuration, the two active MR elements could be on the same side of the bridge (i.e., connected in series) and have resistances that change in opposite directions.

Because shielded devices can act as flux concentrators, it may be desirable to use only unshielded devices in certain designs. Although two of the four bridge MR elements of the sensing devices of FIGS. 1 and 2 are shown as shielded devices, a sensing device with dummy MR elements as described herein need not include any shielded elements. For example, the two shielded bridge MR elements each could be replaced by some type of unshielded MR element that is not responsive to an external magnetic field, for example, the type of structure described in U.S. patent application Ser. No. 10/962,889, entitled "Resistor Having a Predetermined Temperature Coefficient," filed Oct. 12, 2004 with inventors William P. Taylor and Michael C. Doogue, and assigned to Allegro Microsystems, Inc., the assignee of the subject application. Such elements would still serve as reference elements in the bridge circuit. It should be noted that one of the dummy MR elements would also need to be fabricated in such a manner as well. In other configurations, all of the MR elements that form the bridge circuit may be active elements.

Figure 3:
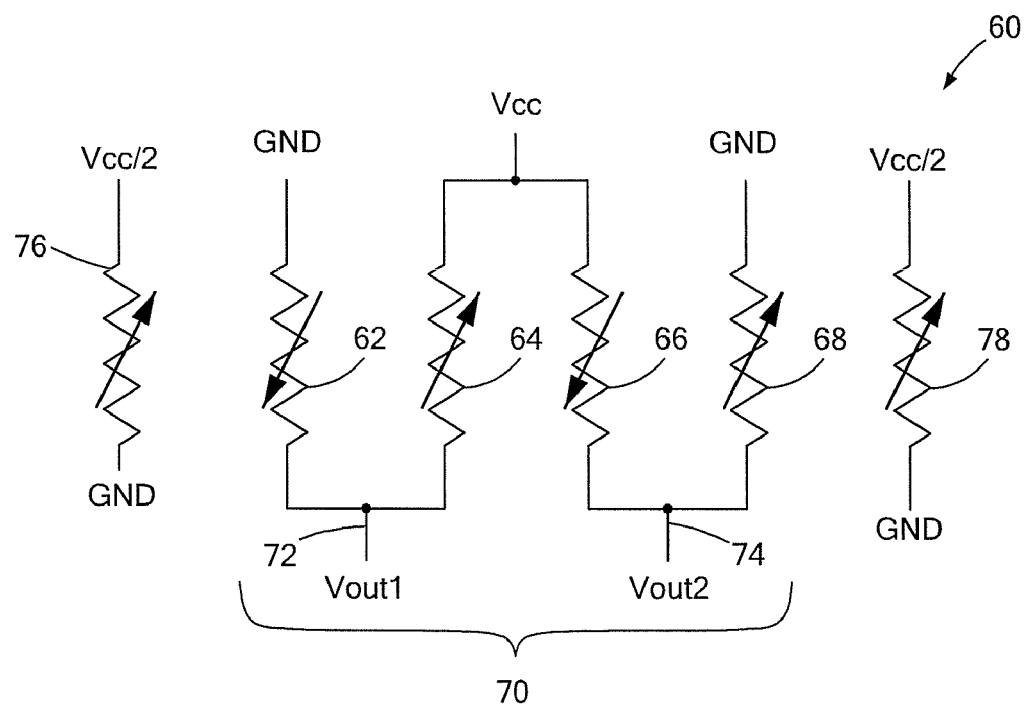
FIG. 3 shows an exemplary MR sensing device that includes two dummy MR elements and a full bridge in which all of the bridge MR elements are sensing elements.

FIG. 3 illustrates a sensing device 60 in which all of the bridge MR elements, shown as MR elements 62, 64, 66, 68 are active elements. The MR elements 62, 64, 66, 68 are connected to form a full bridge circuit 70 having a first bridge output 72 and a second bridge output 74. Because all of the bridge MR elements are active, the dummy MR elements, which are shown as current-carrying dummy MR elements 76, 78, are unshielded and fabricated like the active bridge elements. In this type of bridge circuit configuration, in which all of the bridge elements are active elements, the bridge elements are magnetically oriented such that the resistance of MR elements 64 and 68 increases (with an increase in the external magnetic field to be sensed) while the resistance of MR elements 62 and 66 decreases. Any technique for constructing active bridge MR elements with different orientations may be used. One example is described in U.S. Pat. No. 5,561,368, to Dovek et al., entitled "Bridge Circuit Magnetic Field Sensor Having Spin Valve Magnetoresistive Elements Formed on Common Substrate."

Figure 4:
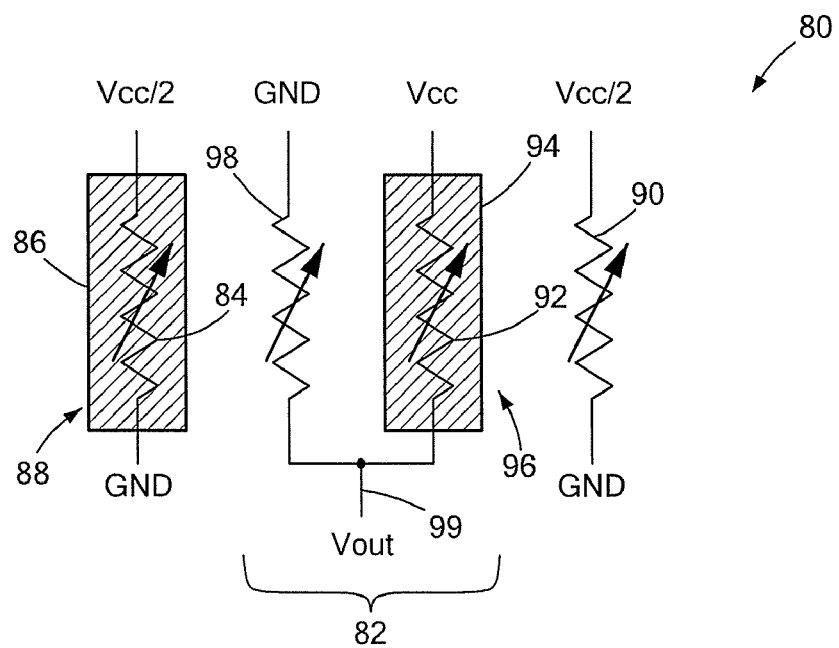
FIG. 4 shows an exemplary MR sensing device that includes a half bridge (of two MR elements) and two dummy MR elements.

In yet another alternative embodiment, and referring now to FIG. 4, the bridge circuit may be implemented as a half-bridge circuit. The half-bridge circuit is also known as a resistor (or voltage) divider circuit. FIG. 4 shows a sensing device 80 that includes a half bridge circuit 82. The sensing device 80 also includes a dummy MR element 84 having a magnetic shield 86 (shielded dummy MR element 88) and a dummy MR element 90. The half bridge circuit 82 includes two bridge MR elements, a bridge MR element 92 having a magnetic shield 94 (shielded MR element 96) and a bridge MR element 98. The shielded MR element 96 and the MR element 98 are connected in series between VCC and GND, with shielded MR element 96 connected to VCC and MR element 98 connected to GND. A single-ended output voltage is provided at bridge output Vout 99. The dummy MR elements 88, 90 each are connected to VCC/2 and GND. Alternatively, each of the dummy MR elements 88, 90 could be connected at both ends to GND (like the dummy MR elements 34, 38 of the full bridge implementation shown in FIG. 1). Although the sensing device 80 is shown to include shielded MR elements, it will be understood that it could be implemented without magnetically shielded MR elements, as was discussed earlier in reference to the full bridge implementation of the bridge circuit. That is, the reference bridge element could be constructed as an unshielded reference bridge element. The like dummy MR element could be similarly constructed. As was also mentioned earlier, the bridge circuit need not include both dummy MR elements. Thus, in the half bridge embodiment of FIG. 4, the dummy MR element 90 could be omitted.

Figure 5:
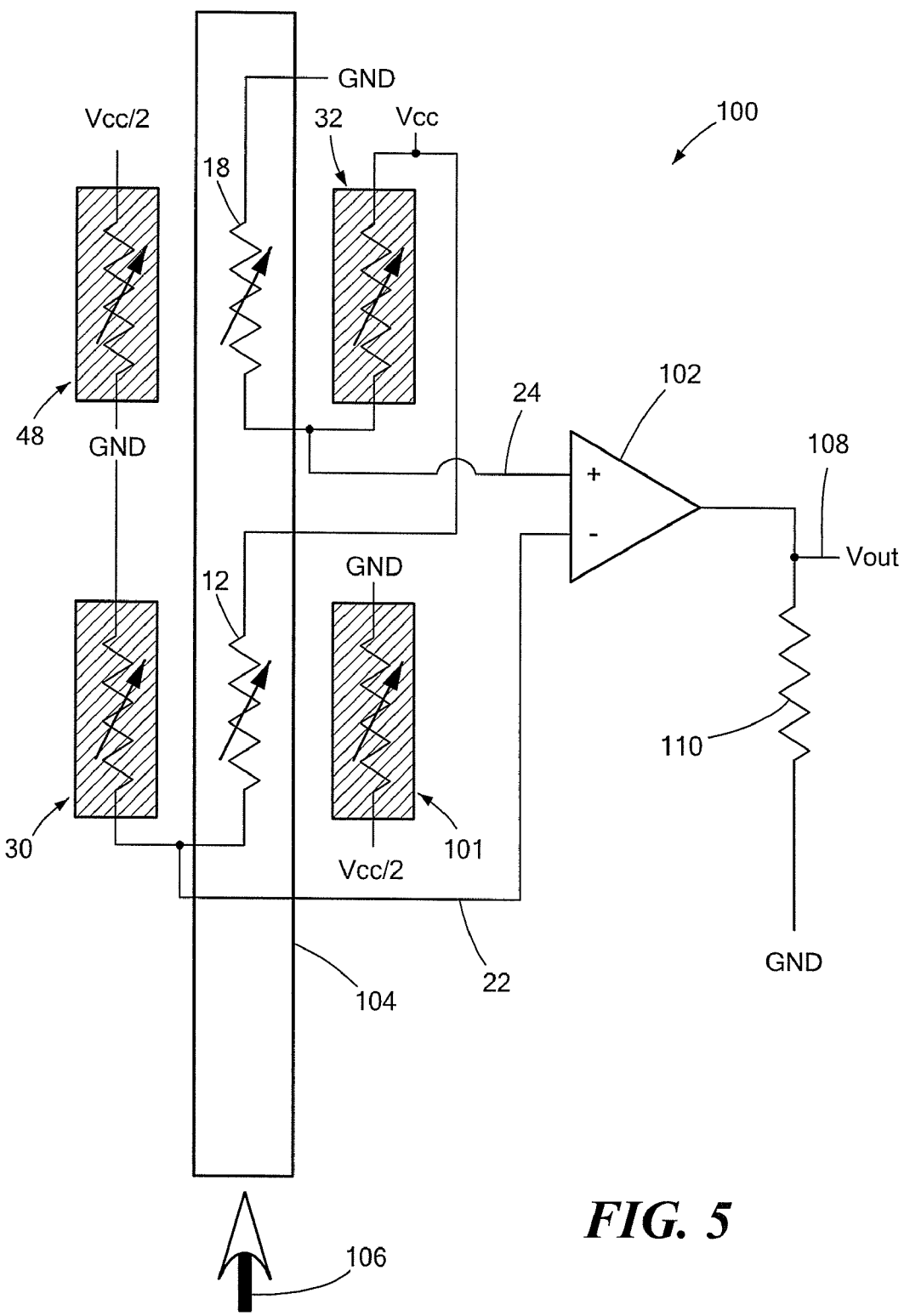
FIG. 5 shows an exemplary current sensor employing the MR sensing device of FIG. 2.
Figure 6A:
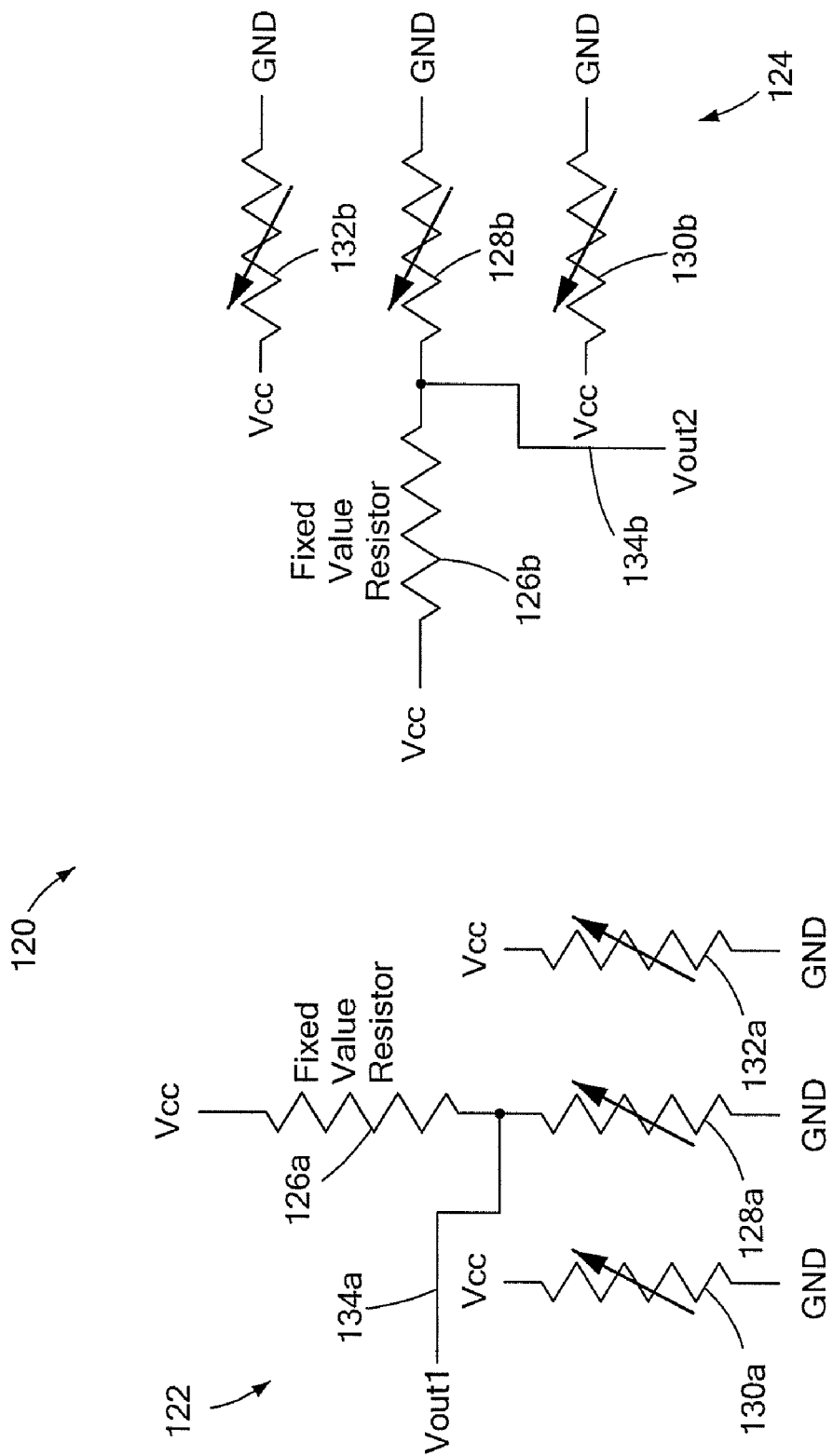
FIGS. 6A-6B show exemplary angle sensors employing MR sensing devices like those shown in FIGS. 1-4.
Figure 6B:
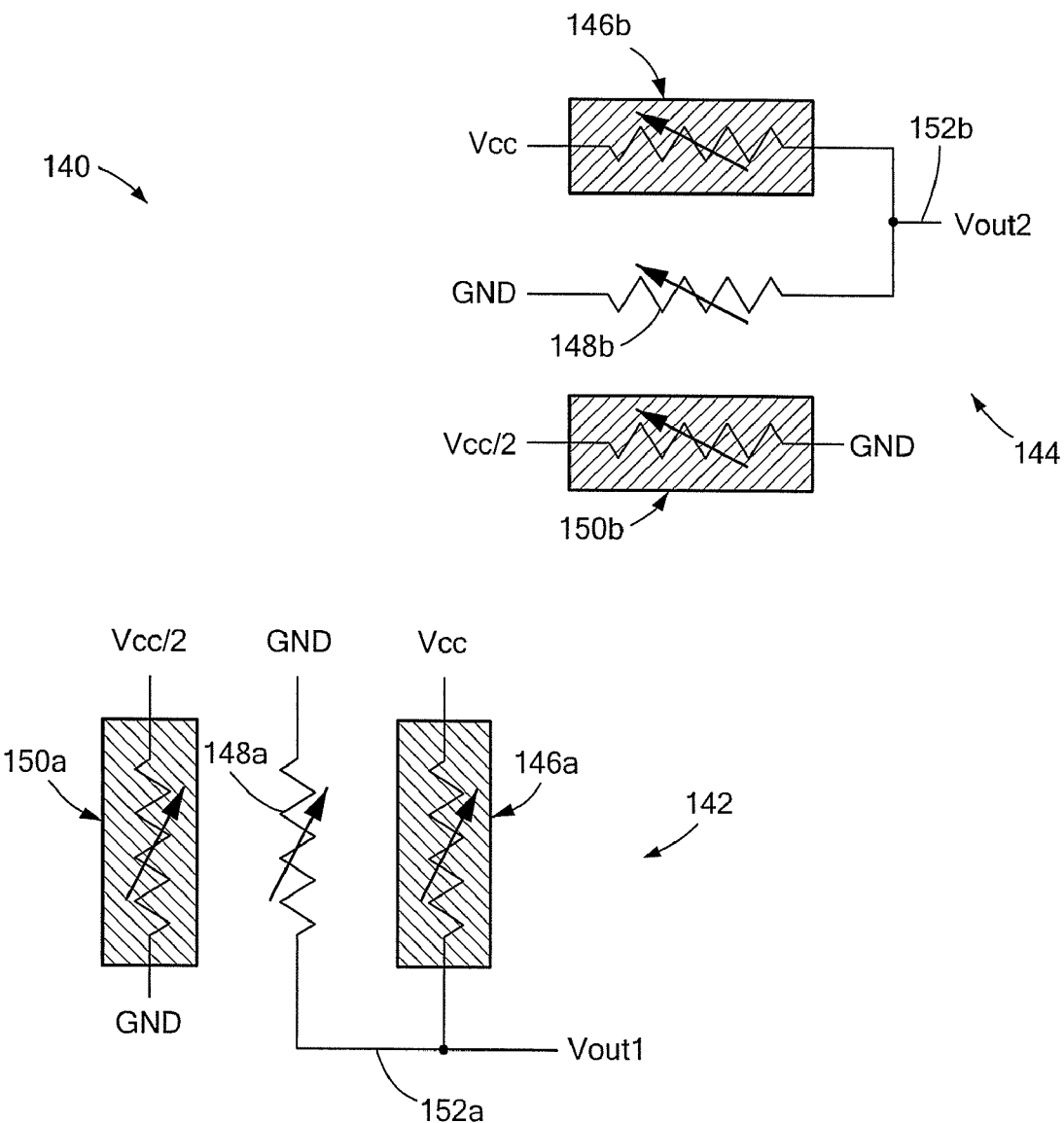

Magnetic field sensing is utilized for control and measurement purposes—for example, proximity detection, linear and rotary position sensing, current sensing and angular position sensing. Thus, the MR sensing device with at least one dummy element, examples of which are illustrated in and described with reference to FIGS. 1-4 above, can be used in various types of MR sensor applications, such as a current sensor or an angle sensor, to give a few examples. FIG. 5 shows an exemplary current sensor. FIGS. 6A-6B show different examples of an angle sensor.

Referring to FIG. 5, a current sensor 100 includes an MR sensing device based on a full bridge configuration like or similar to the one shown in FIG. 2. In the full bridge configuration of FIG. 5, each of the active bridge MR elements 12, 18 is symmetrically balanced by like structures. Shielded dummy MR element 48 and shielded bridge MR element 32 are disposed on opposite sides of active bridge MR element 18. Shielded bridge MR element 30 and a shielded dummy MR element 101 are disposed on opposite sides of the active bridge MR element 12. The bridge outputs of the MR sensing device, bridge outputs 22 and 24, are coupled to an amplifier 102. The current sensor 100 also includes a conduction path 104. A current to be measured would be applied to the conduction path in a direction indication by arrow 106. During operation, the applied current flowing through the conduction path 104 generates a magnetic field, which is sensed by the active bridge MR elements 12 and 18. The sensed magnetic field is converted into a proportional voltage across the bridge outputs 22, 24. Bridge output 22 is connected to the negative input of the amplifier 102. The other bridge output 24 is connected to the positive input of the amplifier 102. The amplifier's output is provided as a current sensor voltage output (Vout) 108 as well coupled to GND through the resistor 110. The current can be determined from the voltage available at Vout and the resistor 110. While the design that is illustrated is that of a simple, open loop current sensor, other current sensor designs (e.g., other types of open loop or closed loop designs) are contemplated as well.

Referring to FIG. 6A, an angle sensor 120 includes two sensing devices (with bridges shown as half bridges) 122 and 124 positioned at an offset angle of 90° to each other. Each sensing device includes a fixed value resistor, shown as resistors 126a, 126b, in the sensing devices 122, 124, respectively, connected to VCC and an active MR element, shown as MR elements 128a, 128b, in sensing devices 122, 124, respectively, which is also connected to GND. In each sensing device, the fixed value resistor is connected to the active MR element to form a half bridge circuit. Disposed on both sides of the MR element in each sensing device is a dummy MR element connected to VCC and to GND. The dummy MR elements in the sensing device 122 are shown as dummy MR elements 130a and 132a. The dummy MR elements in sensing device 124 are shown as dummy MR elements 130b and 132b. In this implementation, the dummy MR elements in each sensing device are like elements. Bridge outputs are shown as bridge output 134a (for sensing device 122) and bridge output 134b (for sensing device 124).

In FIG. 6B, an angle sensor 140 includes two sensing devices (again, with bridges shown as half bridges) 142 and 144 positioned at an offset angle of 90 degrees to each other. In each sensing device, both of the bridge resistors are MR elements, one active and one shielded. Sensing device 142 includes a shielded MR element 146a connected to VCC and to an active MR element 148a, which is also connect to GND. Sensing device 142 also includes a single, shielded dummy MR element 150a. Sensing device 144 includes a shielded MR element 146b connected to VCC and to an active MR element 148b, which is also connect to GND. Sensing device 144 includes a single, shielded dummy MR element 150b. In each sensing device, the active MR element and the shielded MR element are connected to form a half bridge circuit. In each sensing device, the shielded dummy MR element is disposed on one side of each active MR element to balance the shielded bridge element on the opposite side of the active MR element. Outputs of the sensing devices 142, 144 are shown as outputs 152a, 152b, respectively.

In both of these configurations (of FIGS. 6A and 6B), output signals at bridge outputs Vout1 and Vout2 will show an electrical phase shift of 90°. It will be understood that other angles of offset and phase shift may be chosen. Also, although two half bridges are shown, the angle sensor could instead be implemented with two full bridges.

In one exemplary angular positional sensing application, the angle sensor is stationary and a permanent magnet is attached to a rotating shaft (rotor) near the angle sensor. The magnet creates a magnetic field that is in the plane of the angle sensor and rotates with the rotating magnet/rotor assembly. Therefore, when a supply voltage is applied to the bridges, one bridge output voltage may be a sine function and the other bridge output voltage may be a cosine function due to the spatial position of the sensor's elements in relation to the permanent magnet.

Figure 7:
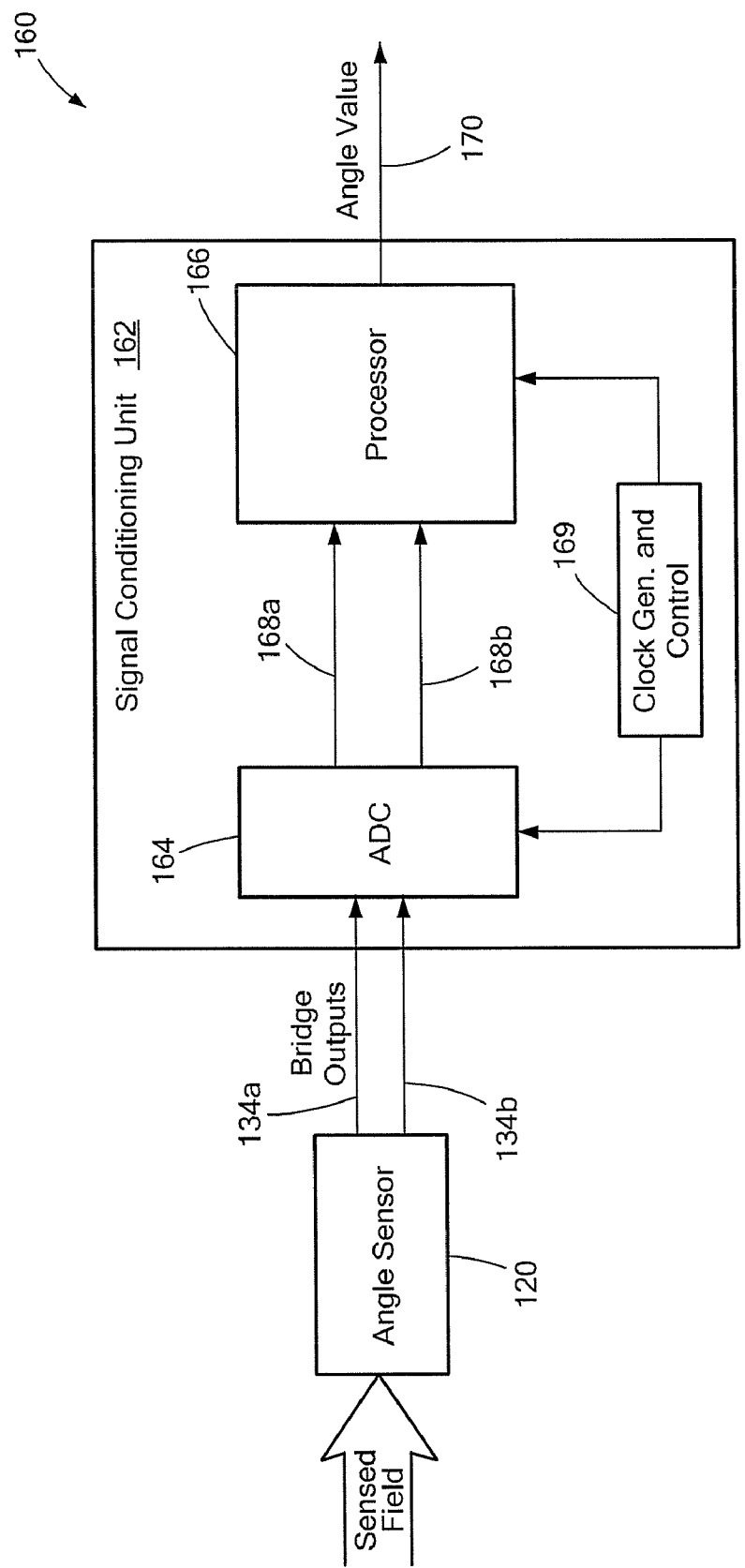
FIG. 7 shows an exemplary angle measurement device that utilizes the angle sensor shown in FIG. 6A.

FIG. 7 shows an angle measurement device 160 that utilizes the output of the angle sensor to determine an angle value. The angle measurement device 160 includes an angle sensor, for example, the angle sensor 120 from FIG. 6A (as shown) or the angle sensor 140 from FIG. 6B, and a sensor signal conditioning unit 162. The signal conditioning unit 162 performs the angle calculation. It combines the two output signals from the angle sensor 120 into one digital output signal. The signal conditioning unit 162 provides a digital output, although it could be designed to provide an analog output instead. Output signals provided at the sensor's bridge outputs 134a, 134b are sampled and then converted into the digital domain by an Analog-to-Digital Converter (ADC) 164. A processor (or microcontroller) 166 receives digital representations of the sensor output signals, shown as ADC outputs 168a, 168b, and determines an angle value from them. Various known algorithms, for example, the CORDIC algorithm, may be used to perform the angle calculation. Clock and control signals are provided to the ADC 164 and the processor 166 by a clock generation and control circuit 169. Once the angle is determined, it is represented as a digital angle value at an output 170 (of the signal conditioning unit 162) that is accessible by an external controller or user (not shown).

Sensor and associated electronics such as amplification and signal conditioning may be packaged in separate integrated circuit chips. Alternatively, devices can be manufactured that incorporate both sensors and signal processing electronics on the same chip.

Although the illustrated embodiments depict sensors with bridge circuits, it will be understood that the use of dummy MR elements is equally applicable to a sensor implemented to use a single MR element (in lieu of a bridge circuit) for magnetic field sensing. For example, it may be desirable to include a pair of like dummy MR elements, one disposed on each side of the single MR element (similar to that shown in FIG. 6A for the active bridge MR element 128a or 128b), in such an implementation for processing-related or other reasons.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A sensing device comprising:
   a magnetoresistive (MR) element to sense a magnetic field; and
   a pair of dummy MR elements, the dummy MR elements in the pair being disposed on opposite sides of the MR element and being symmetrical in terms of structure and position relative to the MR element.

2. The sensing device of claim 1 wherein the MR element and the dummy MR elements comprise a selected one of giant magnetoresistance (GMR) elements, magnetic tunnel junction (MTJ) elements or tunneling magnetoresistance (TMR) elements.

3. The sensing device of claim 1 wherein the dummy MR elements are connected to a voltage supply.

4. The sensing device of claim 1 wherein the dummy MR elements each comprise an active MR element.

5. The sensing device of claim 1 further comprising:
a non-MR element electrically connected to the MR element to form a half bridge circuit.

6. The sensing device of claim 5 wherein the non-MR element is a fixed value resistor.

7. The sensing device of claim 5 further comprising:
a second MR element and a second non-MR element electrically connected to form a second half bridge circuit, the second MR element and the second non-MR element of the second half bridge circuit being offset from the MR element and the non-MR element of the half bridge circuit by a predetermined offset angle;
a second pair of dummy MR elements, the dummy MR elements in the second pair being disposed on opposite sides of the second MR element and being symmetrical in terms of structure and position relative to the second MR element.

8. The sensing device of claim 7 wherein the predetermined offset angle is chosen so that output signals produced by the first and second half bridge circuits show a predetermined electrical phase shift.

9. The sensing device of claim 7 wherein the first and second MR elements and the dummy MR elements of the first and second pairs comprise a selected one of a GMR elements, MTJ elements or TMR elements.

10. An angle measurement device comprising:
a first sensing device; and
a second sensing device;
each of the first and second sensing devices comprising:
a magnetoresistive (MR) element and a non-MR element electrically connected to form a half bridge circuit;
a pair of dummy MR elements, each of the dummy elements in the pair being disposed on opposite sides of the MR element and being symmetrical in terms of structure and position relative to the MR element; and
wherein the MR element, the non-MR element and the pair of dummy MR elements of the second sensing device are provided at a predetermined offset angle relative to the MR element, the non-MR element and the pair of dummy MR elements of the first sensing device.

11. The angle measurement device of claim 10, further comprising:
a device, coupled to the first and second sensing devices, to determine an angle from output signals produced by the first and second sensing devices.

* * * * *

UNITED STATES PATENT AND TRADEMARK OFFICE
CERTIFICATE OF CORRECTION

PATENT NO. : 7,859,255 B2
APPLICATION NO. : 12/840717
DATED : December 28, 2010
INVENTOR(S) : Doogue et al.

Page 1 of 1

It is certified that error appears in the above-identified patent and that said Letters Patent is hereby corrected as shown below:

Col. 5, line 8, delete "MJT" and replace with --MTJ--.

Col. 7, line 42, delete "connect" and replace with --connected--.

Col. 7, line 46, delete "connect" and replace with --connected--.

Signed and Sealed this
Nineteenth Day of April, 2011

David J. Kappos
*Director of the United States Patent and Trademark Office*